(12) United States Patent
Tanabe et al.

(10) Patent No.: US 10,950,481 B2
(45) Date of Patent: Mar. 16, 2021

(54) METHOD FOR MANUFACTURING THIN SUBSTRATE

(71) Applicant: SHIN-ETSU CHEMICAL CO., LTD., Tokyo (JP)

(72) Inventors: Masahito Tanabe, Annaka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/415,259

(22) Filed: May 17, 2019

(65) Prior Publication Data

US 2019/0371644 A1 Dec. 5, 2019

(30) Foreign Application Priority Data

Jun. 4, 2018 (JP) .............................. JP2018-106775

(51) Int. Cl.
*H01L 21/683* (2006.01)
*C09J 183/04* (2006.01)
(Continued)

(52) U.S. Cl.
CPC ........ *H01L 21/6836* (2013.01); *C09J 183/04* (2013.01); *H01L 21/0209* (2013.01); *H01L 21/304* (2013.01); *H01L 21/76897* (2013.01); *H01L 25/0657* (2013.01); *C08G 77/20* (2013.01); *C08G 77/70* (2013.01);
(Continued)

(58) Field of Classification Search
CPC .................................................. H01L 21/6836
See application file for complete search history.

(56) References Cited

U.S. PATENT DOCUMENTS

| 7,541,264 B2 | 6/2009 | Gardner et al. |
| 2005/0233547 A1 | 10/2005 | Noda et al. |

(Continued)

FOREIGN PATENT DOCUMENTS

| EP | 2 551 322 A1 | 1/2013 |
| EP | 3 121 838 A1 | 1/2017 |
| JP | 2004-064040 A | 2/2004 |

OTHER PUBLICATIONS

Nov. 13, 2019 extended Search Report issued in European Patent Application No. 19174568.6.

*Primary Examiner* — Daniel H Lee
(74) *Attorney, Agent, or Firm* — Oliff PLC

(57) ABSTRACT

A method for manufacturing a thin substrate uses a temporary adhesive film for substrate processing for temporarily adhesion of a substrate to a support on a surface of the substrate opposite to a surface to be processed, the temporary adhesive film for substrate processing containing a siloxane bond-containing polymer having a weight average molecular weight of 3,000 to 500,000 in an amount of 10 parts by mass or more and 100 parts by mass or less relative to 100 parts by mass; and includes: (a) laminating the temporary adhesive film for substrate processing onto the support and/or the surface of the substrate opposite to the surface to be processed; (b) bonding thereof under reduced pressure; (c) processing the substrate by grinding or polishing; (d) treating the substrate with acid or base; (e) other processing; (f) separating the processed substrate from the support; and (g) cleaning the substrate.

5 Claims, 1 Drawing Sheet

(51) Int. Cl.
*H01L 21/02* (2006.01)
*H01L 21/304* (2006.01)
*H01L 21/768* (2006.01)
*H01L 25/065* (2006.01)
C08G 77/20 (2006.01)
C08G 77/00 (2006.01)

(52) U.S. Cl.
CPC .... *C08G 77/80* (2013.01); *H01L 2221/68327* (2013.01); *H01L 2221/68372* (2013.01); *H01L 2221/68386* (2013.01); *H01L 2225/06513* (2013.01); *H01L 2225/06541* (2013.01)

(56) References Cited

U.S. PATENT DOCUMENTS

| | | | |
|---|---|---|---|
| 2013/0029145 A1* | 1/2013 | Kato | C09J 183/04 |
| | | | 428/354 |
| 2017/0069521 A1* | 3/2017 | Sugo | B32B 27/26 |

* cited by examiner

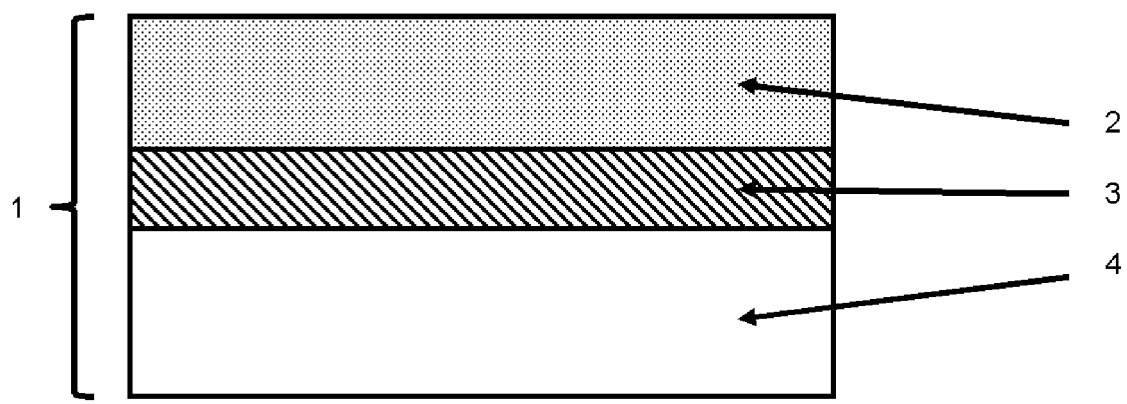

METHOD FOR MANUFACTURING THIN SUBSTRATE

TECHNICAL FIELD

The present invention relates to a method for manufacturing a thin substrate.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) electrode to form a multilayer. This requires processing steps of thinning a substrate by grinding a non-circuit-forming surface (also referred to as "back surface") of the substrate on which a semiconductor circuit has been formed, followed by forming an electrode including a TSV on the back surface.

In the step of grinding the back surface of a silicon substrate, a protective tape for the back surface is conventionally attached to a surface opposite to the surface to be ground to prevent the wafer from breaking during grinding. However, this tape uses an organic resin film as the base material, which has flexibility, but inadequate strength and heat resistance. Thus, this tape is not suited to the steps of forming a TSV and forming a wiring layer on the back surface.

In this context, it has been suggested a system of bonding a semiconductor substrate to a support made of silicon, glass or the like via an adhesive layer, making it possible to sufficiently withstand the steps of grinding the back surface and forming a TSV and an electrode on the back surface (see Patent Document 1, for example). The key to this system is the adhesive layer used for bonding the substrate to the support. The adhesive layer is required to have a sufficient durability to bond the substrate to the support without gaps and to withstand subsequent steps, and is also required to allow the thin substrate to be easily separated from the support finally. As described above, this adhesive layer is finally removed and is referred to as "temporary adhesive layer" (or temporary adhesive material layer) in this description. In Patent Document 2, for example, the temporary adhesive layer is separated by dipping to an agent.

It has been possible to produce a thin semiconductor substrate by forming a temporary adhesive layer on a semiconductor substrate of silicon or the like, bonding a support to give a laminated substrate, followed by processing of cutting and polishing the back surface of the semiconductor substrate to make the semiconductor substrate thin plate, and separating the temporary adhesive material. In the recent semiconductor processing, however, the thinning step increasingly comes to involve various operation steps in addition to the processing steps of grinding and polishing. These demands raise an issue in the system of separating a temporary adhesive layer by dipping to an agent as in Patent Document 2, that is, this system is unable to add an operation step required to have chemical resistance.

CITATION LIST

Patent Literature

PATENT LITERATURE 1: Japanese Patent Laid-Open Publication No. 2004-64040 PATENT LITERATURE 2: U.S. Pat. No. 7,541,264

SUMMARY OF THE INVENTION

Technical Problem

The present invention was accomplished in view of the above-described issues. It is an object of the present invention to provide a method for manufacturing a thin substrate in which temporary adhesion is facilitated between a substrate and a support such that the temporary adhesive material layer is rapidly formed on a substrate or a support, is allowed to be treated with acid or base, and is easily separated from the support.

Solution to Problem

To accomplish the object, the present invention provides a method for manufacturing a thin substrate using a temporary adhesive film for substrate processing for temporarily adhesion of a substrate to a support on a surface of the substrate opposite to a surface to be processed, characterized by:

the temporary adhesive film for substrate processing containing a siloxane bond-containing polymer having a weight average molecular weight of 3,000 to 500,000 in an amount of 10 parts by mass or more and 100 parts by mass or less relative to 100 parts by mass of the total mass of the temporary adhesive film; and including the following steps (a) to (g):

(a) laminating the temporary adhesive film for substrate processing onto the support and/or the surface of the substrate opposite to the surface to be processed;

(b) bonding the substrate and the support under reduced pressure via the temporary adhesive film for substrate processing laminated in the step (a);

(c) processing the substrate by grinding or polishing the surface to be processed of the substrate;

(d) treating the surface to be processed of the substrate with acid or base;

(e) processing the surface to be processed of the substrate by processing other than grinding, polishing, or treatment with acid or base;

(f) separating the processed substrate from the support; and (g) cleaning the substrate.

The inventive method for manufacturing a thin substrate, using a specific temporary adhesive film for substrate processing, makes it possible to facilitate temporary adhesion between a substrate and a support without causing peeling or bubbles at the interface of the substrate and the support to improve the productivity of a thin substrate such that the temporary adhesive material layer is allowed to form on a substrate or a support rapidly, to be treated with acid or base, and to be easily separated from the support, thereby making it possible to apply various steps of treating a substrate.

The temporary adhesive film for substrate processing used in the present invention contains a siloxane bond-containing polymer having a weight average molecular weight of 3,000 to 500,000 in an amount of 10 parts by mass or more and 100 parts by mass or less relative to 100 parts by mass of the total mass of the temporary adhesive film. The temporary adhesive film preferably contains 50 parts by mass or more of the siloxane bond-containing polymer relative to 100 parts by mass of the total mass thereof. On the other hand, the content of less than 10 parts by mass causes an issue of lowering the adhesion properties in bonding a substrate and a support.

The content of the siloxane bond-containing polymer in the above range is preferable because it makes the resistance to processing excellent in various steps of treating a substrate including a step of treating a surface to be processed of the substrate with acid or base.

It is preferable that the temporary adhesive film for substrate processing exhibit a peeling strength of 20 mN/25 mm or more and 500 mN/25 mm or less between the temporary adhesive film for substrate processing and the substrate or the support in a peel test at 25° C. in a direction of 180° degree.

The temporary adhesive film for substrate processing preferably has such a peeling strength because the chemical resistance is further improved in the subsequent processing, the risk of slipping a substrate is prevented during grinding of the substrate, and the separation is securely facilitated.

In this case, it is preferable that the siloxane bond-containing polymer have a repeating unit shown by the following general formula (1):

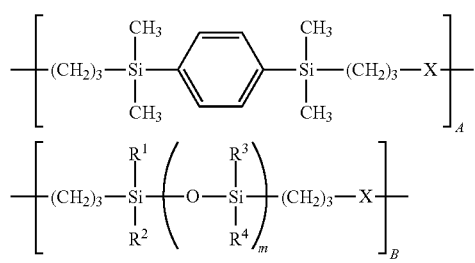

wherein $R^1$ to $R^4$ each independently represent the same or different monovalent hydrocarbon group having 1 to 8 carbon atoms; "m" is an integer of 1 to 100; B is a positive number, A is 0 or a positive number, provided that A+B=1; "x" represents a divalent organic group shown by the following general formula (2):

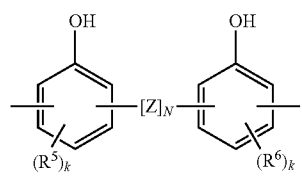

wherein Z represents a divalent organic group selected from any of

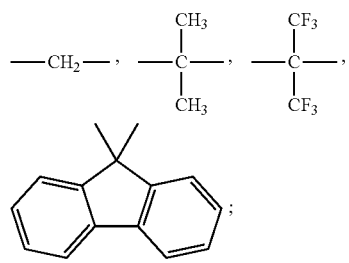

N represents 0 or 1; $R^5$ and $R^6$ each independently represent the same or different alkyl or alkoxy group having 1 to 4 carbon atoms; and "k" represents any of 0, 1, and 2.

The siloxane bond-containing polymer like this is preferable because it further excels in chemical resistance.

In this case, it is preferable that the siloxane bond-containing polymer have a repeating unit shown by the following general formula (3):

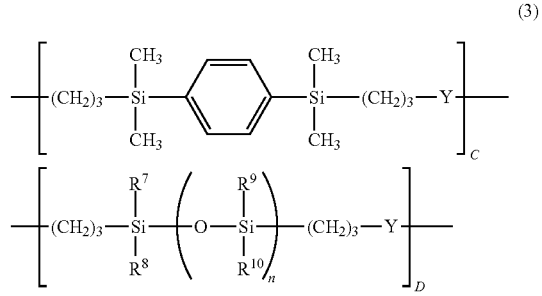

wherein $R^7$ to $R^{10}$ each independently represent the same or different monovalent hydrocarbon group having 1 to 8 carbon atoms; "n" is an integer of 1 to 100; D is a positive number, C is 0 or a positive number, provided that C+D=1; and Y is a divalent organic group shown by the following general formula (4):

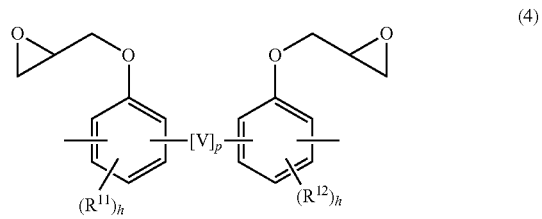

wherein V represents a divalent organic group selected from any of

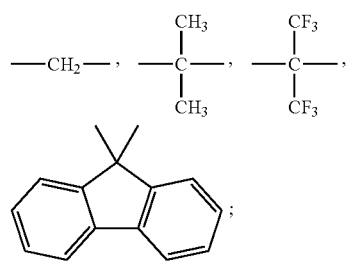

"p" represents 0 or 1; $R^{11}$ and $R^{12}$ each independently represent the same or different alkyl or alkoxy group having 1 to 4 carbon atoms; and "h" is any of 0, 1, and 2.

The siloxane bond-containing polymer like this is preferable because it further excels in chemical resistance.

In this case, it is preferable that the siloxane bond-containing polymer be a cured material of a composition containing:

(p1) an organopolysiloxane having an alkenyl group in a molecule thereof, (p2) an organohydrogenpolysiloxane containing two or more silicon atom-bonded hydrogen atoms (Si—H groups) in a molecule thereof, in such an amount that a mole ratio of the Si—H group in the component (p2) to the alkenyl group in the component (p1) ranges from 0.3 to 15; and (p3) a platinum-based catalyst.

The siloxane bond-containing polymer like this is preferable because it allows the temporary adhesive material layer containing the siloxane bond-containing polymer to be efficiently separated from a substrate or a support.

Advantageous Effects of Invention

As described above, the inventive method for manufacturing a thin substrate employs a specific temporary adhesive film for substrate processing to be laminated onto a substrate or a support, thereby making it possible to form a temporary adhesive material layer onto a substrate or a support in steps (a) to (b) easily and in a short time to have excellent resistance to polishing treatment in the step (c) and to treatment with acid or base in the step (d). In the present invention, the temporary adhesive material formed on a substrate or a support is also improved in dimensional stability to decrease the deformation of the laminate, is highly adaptable to the step (e) (e.g., the step of forming a TSV, the step of forming a wiring layer on the back surface), and is excellent in filling characteristics and heat resistance. In the step (f), the produced thin substrate can be easily separated from a support, for example, at room temperature, and even a fragile thin substrate can be produced easily thereby. In the step (g), the temporary adhesive material remained on the substrate surface can be easily removed by cleaning, thereby making it possible to produce a thin substrate without staining the surface. In particular, due to the advantage of excellent resistance (chemical resistance) to treatment with acid or base in the step (d), the temporary adhesive material layer in bonding a substrate to a support is provided with sufficient durability that can withstand the subsequent steps while enabling a thin substrate to be separated from a support conveniently at the end, and accordingly, it is possible to widen the variation of processing that can be adopted in the step (e).

BRIEF DESCRIPTION OF DRAWING

FIG. 1 is a schematic diagram to show an example of a laminate for substrate processing produced using the inventive temporary adhesive film for substrate processing.

DESCRIPTION OF EMBODIMENTS

As described above, it has been desired to develop a method for manufacturing a thin substrate which facilitates temporary adhesion such that a temporary adhesive material layer is allowed to form on a substrate or a support rapidly, to have excellent dimensional stability as well as excellent resistance to polishing processing and treatment with acid or base, and to be easily separated, thereby improving the productivity of thin substrates.

The present inventors have earnestly studied to accomplish the above object and consequently found that a thin substrate having a through electrode structure or a bump connection structure can be produced conveniently by a method for manufacturing a thin substrate using a temporary adhesive film for substrate processing for temporarily adhesion of a substrate to a support on a surface of the substrate opposite to a surface to be processed, with the temporary adhesive film for substrate processing containing a siloxane bond-containing polymer having a weight average molecular weight of 3,000 to 500,000 in an amount of 10 parts by mass or more and 100 parts by mass or less relative to 100 parts by mass of the total mass of the temporary adhesive film, and including all of the steps (a) to (g) described below; thereby bringing the present invention to completion.

That is, the present invention is a method for manufacturing a thin substrate using a temporary adhesive film for substrate processing for temporarily adhesion of a substrate to a support on a surface of the substrate opposite to a surface to be processed, characterized in that:

the temporary adhesive film for substrate processing contains a siloxane bond-containing polymer having a weight average molecular weight of 3,000 to 500,000 in an amount of 10 parts by mass or more and 100 parts by mass or less relative to 100 parts by mass of the total mass of the temporary adhesive film; and the method includes the following steps (a) to (g):

(a) laminating the temporary adhesive film for substrate processing onto the support and/or the surface of the substrate opposite to the surface to be processed;

(b) bonding the substrate and the support under reduced pressure via the temporary adhesive film for substrate processing laminated in the step (a);

(c) processing the substrate by grinding or polishing the surface to be processed of the substrate;

(d) treating the surface to be processed of the substrate with acid or base;

(e) processing the surface to be processed of the substrate by processing other than grinding, polishing, or treatment with acid or base;

(f) separating the processed substrate from the support; and (g) cleaning the substrate.

Hereinafter, the present invention will be described specifically, but the present invention is not limited thereto.

The First Embodiment

The temporary adhesive film for substrate processing used in the present invention contains a siloxane bond-containing polymer having a weight average molecular weight of 3,000 to 500,000 in an amount of 10 parts by mass or more and 100 parts by mass or less relative to 100 parts by mass of the total mass, in which the siloxane bond-containing polymer is preferably contained in an amount of 50 parts by mass or more. Although the temporary adhesive film for substrate processing in the present invention is not particularly limited if it contains a siloxane bond-containing polymer having a weight average molecular weight of 3,000 to 500,000 in an amount of 10 parts by mass or more and 100 parts by mass or less relative to 100 parts by mass of the total mass, the temporary adhesive film preferably contains a siloxane bond-containing polymer shown by the following general formula (1) and/or (3) as the main ingredient.

As the siloxane bond-containing polymer, it is possible to use both of the polymer shown by the following general formula (1) and the polymer shown by the following general formula (3). In that case, the ratio (mass ratio) thereof is preferably (1):(3)=0.1:99.9 to 99.9:0.1, more preferably (1):(3)=1:99 to 99:1.

The polymer of general formula (1) (phenolic siloxane polymer):

Siloxane bond-containing polymer having a repeating unit(s) shown by the following general formula (1) with a weight average molecular weight of 3,000 to 500,000, preferably 10,000 to 100,000 in terms of polystyrene determined by gel permeation chromatography (GPC),

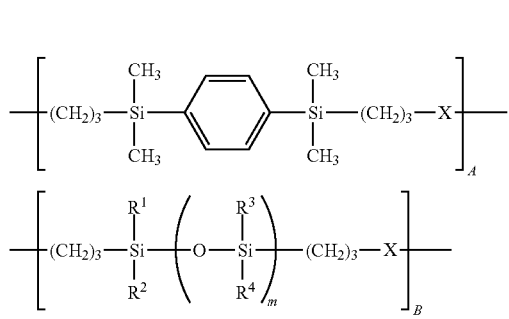
(1)

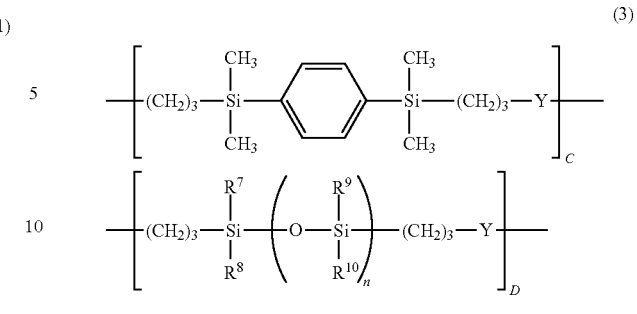
(3)

wherein $R^1$ to $R^4$ may be the same or different and each represent a monovalent hydrocarbon group having 1 to 8 carbon atoms; "m" is an integer of 1 to 100; B is a positive number, A is 0 or a positive number; and X is a divalent organic group shown by the following general formula (2); A+B=1, A is preferably 0 to 0.9, B is preferably 0.1 to 1, and when A is larger than 0, A is preferably 0.1 to 0.7 and B is preferably 0.3 to 0.9, wherein $R^7$ to $R^{10}$ may be the same or different and each represent a monovalent hydrocarbon group having 1 to 8 carbon atoms; "n" is an integer of 1 to 100; D is a positive number; C is 0 or a positive number; Y is a divalent organic group shown by the following general formula (4); C+D=1, C is preferably 0 to 0.9 and D is preferably 0.1 to 1, and when C is larger than 0, C is preferably 0.1 to 0.7 and D is preferably 0.3 to 0.9,

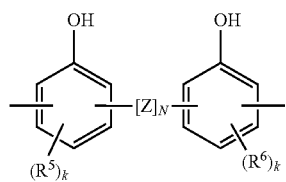
(2)

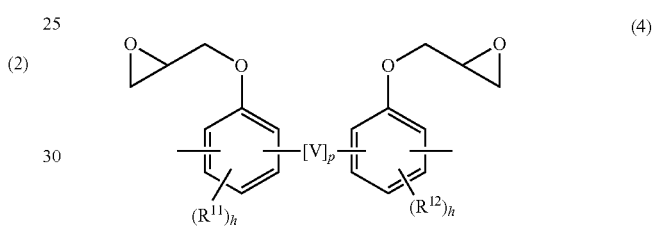
(4)

wherein Z represents a divalent organic group selected from any of wherein V represents a divalent organic group selected from any of

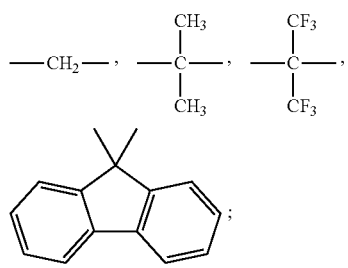

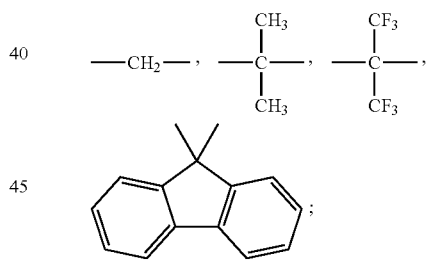

N is 0 or 1; $R^5$ and $R^6$ each represent an alkyl group or an alkoxy group having 1 to 4 carbon atoms and may be the same or different from each other; and "k" is any of 0, 1, and 2.

In this case, illustrative examples of $R^1$ to $R^4$ include a methyl group, an ethyl group, and a phenyl group; "m" is an integer of 1 to 100, preferably 3 to 60, more preferably 8 to 40; and B/A is larger than 0 and smaller than 20, particularly from 0.5 to 5.

The polymer of general formula (3) (epoxy-modified siloxane polymer):

Siloxane bond-containing polymer having a repeating unit shown by the following general formula (3) with a weight average molecular weight of 3,000 to 500,000 in terms of polystyrene determined by GPC, "p" is 0 or 1; $R^{11}$ and $R^{12}$ each represent an alkyl group or an alkoxy group having 1 to 4 carbon atoms and may be the same or different from each other; and "h" is any of 0, 1, and 2.

In this case, illustrative examples of $R^7$ to $R^{10}$ are the same as those illustrated in $R^1$ to $R^4$ in the above general formula (1), "n" is an integer of 1 to 100, preferably 3 to 60, more preferably 8 to 40; and D/C is larger than 0 and smaller than 20, particularly from 0.5 to 5.

The siloxane bond-containing polymer can be dissolved in a solvent and used for forming a temporary adhesive film. Illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combination of two or more kinds. The solution can be subjected to filtration in accordance with needs.

Additionally, it is also possible to add a known antioxidant and/or a filler such as silica in an amount of 50 parts by mass or less based on 100 parts by mass of the temporary adhesive film to improve the heat resistance. Moreover, a surfactant may be added to improve the coating uniformity.

Illustrative examples of the antioxidant that can be added into the temporary adhesive film include hindered phenol compounds such as tetrakis[methylene-(3,5-di-tert-butyl-4-hydroxyhydrocinnamate)]methane (product name: Adekastab AO-60).

The film to be formed preferably has a film thickness of 5 to 150 μm, more preferably 10 to 120 μm, though the film thickness is not particularly limited. Such a film thickness is preferable because the film thickness of 5 μm or more makes it possible to sufficiently withstand the grinding step for thinning the substrate, and the film thickness of 150 μm or less prevents the resin from deforming in the heat treatment process such as TSV formation process and makes it possible to withstand for practical use.

The Second Embodiment

Although the temporary adhesive film for substrate processing in the present invention is not particularly limited if it contains a siloxane bond-containing polymer having a weight average molecular weight of 3,000 to 500,000 in an amount of 10 parts by mass or more relative to 100 parts by mass of the total mass, the siloxane bond-containing polymer is preferably a cured material of a composition containing:

(p1) an organopolysiloxane having an alkenyl group in the molecule, (p2) an organohydrogenpolysiloxane containing two or more silicon atom-bonded hydrogen atoms (Si—H groups) in one molecule, in such an amount that a mole ratio of the Si—H group in the component (p2) to the alkenyl group in the component (p1) ranges from 0.3 to 15; and (p3) a platinum-based catalyst.

Hereinafter, each component will be described.
[Component (p1)]

The component (p1) is an organopolysiloxane having an alkenyl group(s) in the molecule. The component (p1) is preferably a linear or branched organopolysiloxane containing 0.3 to 10 mol % of alkenyl groups based on the molar amount of the Si in one molecule (mole of alkenyl group/mole of Si). The organopolysiloxane particularly preferably contains 0.6 to 9 mol % of alkenyl groups based on the molar amount of Si.

Illustrative examples of such organopolysiloxane include compounds shown by the following formula (5) and/or (6),

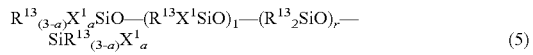

$$R^{13}_{(3-a)}X^1_a SiO-(R^{13}X^1 SiO)_1-(R^{13}_2 SiO)_r-SiR^{13}_{(3-a)}X^1_a \quad (5)$$

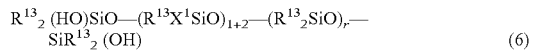

$$R^{13}_2(HO)SiO-(R^{13}X^1 SiO)_{1+2}-(R^{13}_2 SiO)_r-SiR^{13}_2(OH) \quad (6)$$

wherein each $R^{13}$ independently represents a monovalent hydrocarbon group without having an aliphatic unsaturated bond; each $X^1$ independently represents a monovalent organic group containing an alkenyl group; and "a" is an integer of 0 to 3. In the formula (5), 2a+1 is such a number that the content of alkenyl group is 0.3 to 10 mol % per one molecule. In the formula (6), 1+2 is such a number that the content of alkenyl group is 0.3 to 10 mol % per one molecule. "1" is 0 or a positive number of 500 or less, and "r" is a positive number of 1 to 10,000.

In the above formulae, $R^{13}$ is preferably a monovalent hydrocarbon group having 1 to 10 carbon atoms without having an aliphatic unsaturated bond. Examples thereof include alkyl groups such as a methyl group, an ethyl group, a propyl group, and a butyl group; cycloalkyl groups such as a cyclohexyl group; and aryl groups such as a phenyl group and a tolyl group. In particular, alkyl groups such as a methyl group and a phenyl group are preferable.

The monovalent organic group having an alkenyl group of $X^1$ is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferable.

In the general formula (5), "a" is an integer of 0 to 3, preferably 1 to 3 because it allows terminals of the molecular chain to be blocked with alkenyl groups to complete the reaction within a short time by the alkenyl groups with good reactivity at the terminal of the molecular chain, and further preferably a=1 industrially in view of the cost. This alkenyl group-containing organopolysiloxane is preferably in an oil state or a crude rubber state. The alkenyl group-containing organopolysiloxane may be linear or branched. The component (p1) may be used in combination of two or more kinds.

It is to be noted that the component (p1) preferably has a number average molecular weight (Mn) of 100000 to 500000 determined by GPC.
[Component (p2)]

The component (p2) is a crosslinker and an organohydrogenpolysiloxane having two or more silicon-bonded hydrogen atoms (Si—H groups) per one molecule. The component (p2) has at least 2, preferably 2 or more and 100 or less, more preferably 3 or more and 50 or less silicon-bonded hydrogen atoms (SiH groups) per one molecule; and may be linear, branched, or cyclic.

The viscosity at 25° C. of the organohydrogen-polysiloxane of the component (p2) is preferably 1 to 5,000 mPa·s, more preferably 5 to 500 mPa·s. The organohydrogenpolysiloxane may be a mixture of two or more kinds. It is to be noted that the viscosity is measured with a rotational viscometer.

The component (p2) is preferably blended such that the mole ratio of the Si—H group in the component (p2) to the alkenyl group in the component (p1) (Si—H group/alkenyl group) is in a range of 0.3 to 15, preferably 0.3 to 10, more preferably 1 to 8. The mole ratio of 0.3 or more between the SiH group and the alkenyl group is preferable because it prevents risks of lowering the crosslinking density and causing an issue of inability to cure the adhesive layer. The mole ratio of 15 or less prevents excess increase of the crosslinking density and gives sufficient adhesion and tackiness.

[Component (p3)]

The component (p3) is a platinum-based catalyst (i.e., platinum group metal catalyst). Examples thereof include chloroplatinic acid, a solution of chloroplatinic acid in alcohol, a reaction product of chloroplatinic acid with alcohol, a reaction product of chloroplatinic acid with an olefin compound, and a reaction product of chloroplatinic acid with a vinyl group-containing siloxane.

The component (p3) is added in an effective amount, which is generally 1 to 5,000 ppm, preferably 5 to 2,000 ppm, in terms of the mass of platinum with respect to the total of (p1) and (p2). The amount of 1 ppm or more prevents the composition from lowering the curability, lowering the crosslinking density, and lowering the holding force. The amount of 5,000 ppm or less makes it possible to prolong the available time of the treatment solution.

The composition (the thermosetting siloxane polymer composition) can be dissolved in a solvent and used for forming the temporary adhesive material layer as a solution. Illustrative examples of the solvent suitably used include hydrocarbon solvents such as pentane, hexane, cyclohexane, isooctane, nonane, decane, p-menthane, pinene, isododecane, and limonene; and volatile and low-molecular weight siloxanes such as hexamethyldisiloxane and octamethyltrisiloxane. These solvents may be used alone or in combination of two or more kinds. To this composition of a thermosetting siloxane polymer, a known antioxidant can be added to improve the heat resistance. The solution may be filtered in accordance with needs.

In this case, the film to be formed preferably has a film thickness of 0.1 to 30 μm, particularly 1.0 to 15 μm. With the film thickness of 0.1 μm or more, the separation from a substrate or a support is further facilitated. On the other hand, the film thickness of 30 μm or less makes it possible to sufficiently withstand the polishing step in case of forming a thin wafer. Incidentally, this thermosetting siloxane polymer composition may contain a filler such as silica in an amount of 50 parts by mass or less based on 100 parts by mass of the whole mixture of components (p1), (p2), and (p3) of the thermosetting siloxane polymer composition in order to improve the heat resistance.

It is preferable that the peeling strength between the temporary adhesive film for substrate processing and a substrate or a support be 20 mN/25 mm or more and 500 mN/25 mm or less measured in a peel test at 25° C. in a direction of 180° degree. Having such a peeling strength, the temporary adhesive film becomes preferable because the resistance to CVD is further improved in the preceding processing, the risk of slipping a substrate (wafer) is prevented during grinding the substrate (wafer), and the separation is securely facilitated.

[Method for Manufacturing Temporary Adhesive Film for Substrate Processing]

Hereinafter, the method for manufacturing the temporary adhesive film for substrate processing in the present invention will be specifically described, but the manufacturing method is not limited thereto.

The solution for the temporary adhesive film for substrate processing is applied onto a release backing (release film) using a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, an extruder, etc. In this case, the solution is preferably applied onto a support film (e.g., a release backing) at a coating rate of 0.05 to 1000 m/min, particularly 0.1 to 500 m/min.

Subsequently, the release backing coated with the solution for the temporary adhesive film for substrate processing is passed through an in-line drier (an internal air circulation oven), and is dried by removing the organic solvent and volatile component(s) at 40 to 130° C. for 1 to 40 minutes, more preferably at 50 to 120° C. for 2 to 30 minutes to form the temporary adhesive film for substrate processing. Another protective film (release backing) may be laminated by pressing onto the temporary adhesive film for substrate processing using a roll laminator in accordance with needs. In this case, the formed film of the temporary adhesive film for substrate processing preferably has a film thickness of 0.5 to 80 μm, particularly 0.5 to 50 μm.

The temporary adhesive film for substrate processing (and the release backing and the protective film in accordance with needs) laminated as described above is rolled up directly or around a roll axis such that the temporary adhesive film for substrate processing is wound around a paper tube or a plastic tube from the terminal to be a temporary adhesive film roll for substrate processing.

In this case, the temporary adhesive film roll for substrate processing can be obtained without causing deformation in the entire film by rolling up the temporary adhesive film for substrate processing with a tension of 10 to 200 N/m, preferably 20 to 150 N/m at a rate of 0.05 to 1000 m/min, preferably 0.1 to 500 m/min.

In case of using a protective film, the process is preferably finished with lamination and roll-up with a two-stage roll.

It is to be noted that the diameter of the obtained temporary adhesive film roll for substrate processing is preferably 100 to 300 mm in view of stable manufacturing and preventing the rolling habit around a roll axis, so-called curl. As the roll axis, a core tube can be used, for example.

The release film as the release backing and the protective film, which can be used in accordance with needs, are not particularly limited if the film can be separated from the surface layer of the temporary adhesive film for substrate processing without losing the shape of the temporary adhesive film for substrate processing. These films may be a single layer film or a multilayer film in which a plurality of polymer films have been laminated. Plastic films can be used, and illustrative examples thereof include a nylon film, a polyethylene (PE) film, a polyethylene terephthalate (PET) film, a polyethylene naphthalate film, a polyphenylene sulfide (PPS) film, a polypropylene (PP) film, a polystyrene film, a polymethylpetene (TPX) film, a polycarbonate film, a fluorine-containing film, a special polyvinylalcohol (PVA) film, and a polyester film subjected to mold release treatment.

Among them, a polyethylene terephthalate film has appropriate flexibility, mechanical strength, and heat resistance, and is preferable as the release backing (release film). These films may be subjected to various treatments such as corona treatment or coating with release agent. They can be commercially available articles including Cerapeel WZ (RX), Cerapeel BX8 (R) (each available from Toray Advanced Film Co., Ltd.); E7302, E7304 (each available from TOYOBO CO., LTD.); Purex G31, Purex G71T1 (each available from TEIJIN FILM SOLUTIONS LIMITED); PET 38×1-A3, PET 38×1-V8, and PET38X1-X08 (each available from Nippa Co.).

As the protective film, a polyethylene terephthalate film and a polyethylene film, having appropriate flexibility, are preferable. They can be commercially available articles, and illustrative examples of the polyethylene terephthalate include the ones described above. Illustrative examples of the polyethylene include GF-8 (available from TAMAPOLY CO., LTD.), and PE film type O (available from nippa-co.).

Each thickness of the release backing and the protective film is preferably 10 to 100 µm in view of stable manufacturing and preventing the rolling habit around a roll axis, so-called curl.

The temporary adhesive film for substrate processing, taken out of a temporary adhesive film roll for substrate processing manufactured by the above manufacturing method, is excellent in adhesion between temporary adhesive material layers, for example, it excels in chemical resistance.

The inventive method for manufacturing a thin substrate involves the steps (a) to (g).

[Step (a)]

The step (a) is a step of laminating the temporary adhesive film for substrate processing onto the support and/or the surface of the substrate opposite to the surface to be processed.

The substrate to be processed is, for example, a substrate in which one of the surfaces is a circuit-forming surface, and the other surface is a non-circuit-forming surface. The substrate to which the present invention can be applied is normally a semiconductor substrate. As the semiconductor substrate, a disc-shaped wafer and a square substrate can be exemplified. Examples of the wafer include not only a silicon wafer, but also a germanium wafer, a gallium-arsenic wafer, a gallium-phosphorus wafer, and a gallium-arsenic-aluminum wafer. The thickness of the substrate is typically, but not particularly limited to, 600 to 800 µm, more typically 625 to 775 µm. As the support, which is not particularly limited, a substrate such as a silicon wafer, a glass plate, and a quartz wafer can be used. In the present invention, the temporary adhesive film is not necessary irradiated with energy radiation through the support, and the support does not have to be light transmittable thereby.

The temporary adhesive film for substrate processing is taken out of the temporary adhesive film roll for substrate processing, with the temporary adhesive film being formed on a release backing of polyethylene, polyester, etc. Then, this is laminated onto a substrate or a support, and is subjected to cut processing into a required length. Alternatively, the temporary adhesive film is subjected to cut processing into a required length, and then laminated onto a substrate or a support. In this case, the temporary adhesive film for substrate processing can be formed on a substrate while separating the release backing therefrom (with a peeling strength of 10 to 1000 mN/25 mm) in accordance with needs. The temporary adhesive film can also be formed on a support while separating the protective film or may be formed directly. The temporary adhesive film can also be stuck to a substrate or a support while separating another protective film or a release stuff. The temporary adhesive film for substrate processing can be laminated onto a substrate or a support, for example, using a vacuum laminator such as TEAM-100 and TEAM-300 manufactured by Takatori Corporation in case of a wafer.

[Step (b)]

The step (b) is a step of bonding the substrate and the support under reduced pressure via the temporary adhesive film for substrate processing laminated in the step (a). Hereinafter, the step (b) will be described by referring FIG. 1. The laminate 1 of the substrate 2, on which the temporary adhesive material layer 3 had been formed from the temporary adhesive film, and the support 4 is formed as a bonded substrate via the temporary adhesive material layer 3. In this case, this substrate is pressed uniformly under vacuum (under reduced pressure; at a pressure of 1 Pa or less) at a temperature in the range of preferably 40 to 200° C., more preferably 60 to 180° C. to form the laminate (laminated substrate) 1, in which the temporary adhesive material layer 3 is stuck to bond the substrate 2 and the support 4. At this stage, the time for contact bonding is 10 seconds to 10 minutes, preferably 30 seconds to 5 minutes. Examples of a substrate-bonding apparatus include a commercially available wafer-bonding apparatus such as EVG520IS and 850 TB manufactured by EVG Group, and XBS300 manufactured by SUSS MicroTec AG when a wafer is used.

[Step (c)]

The step (c) is a step of grinding or polishing the surface to be processed (the back surface) of the substrate stuck on the support, that is, a step of thinning a substrate by grinding or polishing the back surface of the substrate of the laminate obtained by bonding in the step (b). The method for grinding the back surface of the substrate is not particularly limited, and known grinding methods may be used. The grinding is preferably performed while cooling by feeding water to the substrate and a grinding wheel (e.g. diamond). Examples of an apparatus for grinding the back surface of a substrate include DAG-810 manufactured by DISCO Co., Ltd. The back surface of a substrate may be subjected to CMP polishing.

[Step (d)]

The step (d) is a step of treating a substrate using acid or base to treat the surface to be processed (the back surface) of the substrate stuck on the support. For this treatment, examples of usable acid include $H_2SO_4$, $H_2O_2$, HF, $HNO_3$, and $H_3PO_4$; examples of usable base include $NH_3$, $NMe_4OH$ (Me is a methyl group), and $NH_4OH$; and these acids or bases may be used alone or in combination of two or more kinds for the treatment. The treatment using acid or base (acid- or alkali-treatment) can be performed by subjecting the laminate after the steps (a) to (c) to spraying, coating, or dipping using a treatment solution. This treatment is preferably finished in a short period of 10 seconds to 30 minutes, though the treating time is not particularly limited thereto. After the acid- or alkali-treatment, cleaning and/or drying is performed in accordance with needs.

[Step (e)]

The step (e) is a step of processing other than grinding, polishing, or treatment with acid or base on the surface to be processed of the laminate in which the back surface (non-circuit-forming surface) has been grinded, that is, the laminate thinned by grinding the back surface. This step includes various processes applied in the substrate level. Examples thereof include electrode formation, metal wiring formation, and protective film formation. More specifically, there may be mentioned well-known processes including metal sputtering for forming electrodes or the like, wet etching for etching a sputtered metal layer, patterning process in which a resist is applied and subjected to exposure and development to form a pattern used as a mask for metal wiring formation, resist removal, dry etching, plating with metal, silicon etching for forming a TSV, and formation of an oxide film on silicon surface.

[Step (f)]

Step (f) is a step of separating the substrate processed in the step (e) from the support, that is, a step of separating the substrate 2 from the support 4 after the thinned substrate is subjected to various processing and before dicing. This separating step is generally carried out under relatively low temperature conditions from room temperature to about 60° C. This step may performed by a method in which either the substrate 2 or the support 4 of the laminate 1 is horizontally fixed, and the other is lifted at a certain angle with respect to the horizontal direction; or a method in which a protective film is stuck to the processed surface of the processed substrate 2, and then the substrate 2 and the protective film are separated from the laminate by peeling. Any of these separating methods can be applied to the present invention, though it is not limited to these methods. These separating methods are usually carried out at room temperature.

[Step (g)]

Step (g) is a step of cleaning the temporary adhesive material remained on the surface of the substrate separated in the step (f). The temporary adhesive material layer 3 sometimes remains on the surface of the substrate separated from the support in the step (f). The remained temporary adhesive material layer 3 can be removed by cleaning the substrate.

In the step (g), any cleaning fluid can be used if the fluid can dissolve the temporary adhesive layer 3. Illustrative examples thereof include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; hydrocarbon solvents such as pentane, hexane, cyclohexane, isooctane, nonane, decane, p-menthane, pinene, isododecane, and limonene; and volatile low-molecular siloxane such as hexamethyldisiloxane and octamethyltrisiloxane. These solvents may be used alone or a combination of two or more kinds. If removal is difficult, base or acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is preferably 0.01 to 10 mass %, more preferably 0.1 to 5 mass % in terms of concentration in the cleaning fluid. To improve removal efficiency of the residual matters, an existing surfactant may be added thereto. Cleaning may be performed by paddling with the above-mentioned fluid, spraying, or dipping in a cleaner tank. The temperature in this operation is preferably 10 to 80° C., more preferably 15 to 65° C. If necessary, after dissolving the temporary adhesive material layer in the dissolving fluid, the substrate may be finally rinsed with water or an alcohol and then dried to obtain a thin substrate.

EXAMPLES

Hereinafter, the present invention will be specifically described by showing Examples and Comparative Examples, but the present invention is not limited thereto.

In the following examples, part means part by mass, Me represents a methyl group, and Vi represents a vinyl group.

Resin Solution Preparation Example 1

In a flask equipped with a stirrer, a thermometer, a nitrogen purge system, and a reflux condenser, 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid were introduced, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50 mass %. When the molecular weight of the resin in the solution was measured by GPC, the weight average molecular weight was 45,000 in terms of polystyrene. Then, 0.1 g of tetrakis[methylene-(3,5-di-tert-butyl-4-hydroxyhydrocinnamate)]methane (product name: Adekastab AO-60) was added as an antioxidant. The solution was filtered through a 1-μm membrane filter to give a resin solution (Solution A-1).

Resin Solution Preparation Example 2

In a 5L-flask equipped with a stirrer, a thermometer, a nitrogen purge system, and a reflux condenser, 84.1 g of epoxy compound (M-2) was dissolved in 600 g of toluene, subsequently, 294.6 g of compound (M-3) and 25.5 g of compound (M-4) were added, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 28,000 in terms of polystyrene. Then, this resin solution was filtered through a 1-μm membrane filter to give a resin solution (Solution A-2).

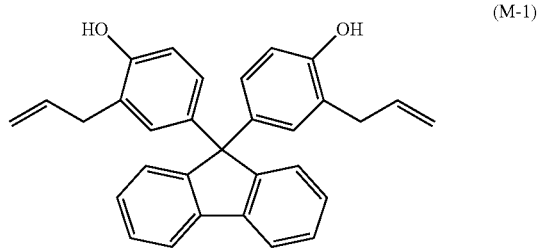

(M-1)

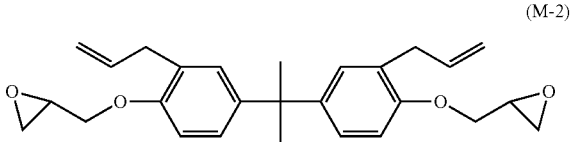

(M-2)

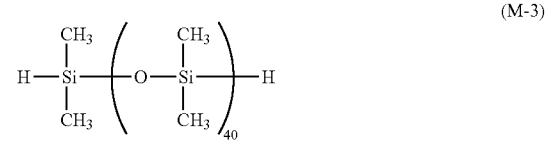

(M-3)

-continued

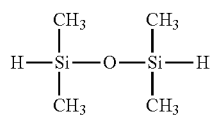
(M-4)

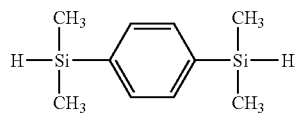
(M-5)

Resin Solution Preparation Example 3

To a solution of 100 parts of polydimethylsiloxane with a number average molecular weight (Mn) of 50,000 determined by GPC having 3 mol % of vinyl groups at the both terminals and the side chain, with the terminals of the molecule being blocked with $SiMe_2Vi$ groups, and 400 parts of isododecane, 10 parts of organohydrogenpolysiloxane shown by the following formula (M-7) was added (in 2 moles relative to the alkenyl groups) and mixed. Additionally, platinum catalyst CAT-PL-5 (manufactured by Shin-Etsu Chemical Co., Ltd.) was added thereto in an amount of 0.05 parts relative to 100 parts of the polydimethylsiloxane, and this was filtered through a 0.2-µm membrane filter to give a resin solution (Solution B-1).

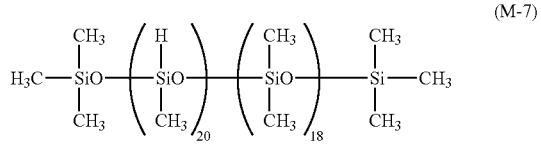
(M-7)

Resin Solution Preparation Example 4

Into 176 g of isononane, 24 g of SEPTON 2002 (manufactured by Kuraray Co., Ltd.), which is a thermoplastic resin of hydrogenated styrene-ethylene-propylene copolymer, was dissolved to give a 12 mass % solution of hydrogenated styrene-ethylene-propylene copolymer in isononane. The obtained solution was filtered through a 0.2-µm membrane filter to give a resin solution (Solution C-1).

—Film Production Step—

The resin solution (Solution A-1) was applied onto a polyethylene terephthalate (PET) film (thickness: 38 µm) as a release backing at a coating rate of 0.4 m/min by using a comma coater as a film coater, and then dried to produce (A-1) layer. Then, to the surface of the produced film, a polyethylene (PE) film (thickness: 100 µm) was stuck as a protective film at a pressure of 1 MPa. This was rolled-up around a plastic tube at a rate of 0.4 m/min and a tension of 30 N to form a roll of Temporary adhesive film for substrate processing (A-1) with a diameter of 130 mm.

In the same manner, (Solution A-2), (Solution B-1), and (Solution C-1) were each applied, and the obtained laminates were rolled-up to produce the rolls of (A-2), (B-1), and (C-1) respectively.

The resin solution (Solution A-1) was applied onto a polyethylene terephthalate (PET) film (thickness: 38 µm) as a release backing at a coating rate of 0.4 m/min by using a comma coater as a film coater, and then dried to produce (A-1) layer. Subsequently, the resin solution (Solution B-1) was applied onto the polyethylene terephthalate (PET) film, onto which the (A-1) layer had been formed, at a coating rate of 0.4 m/min by using a comma coater as a film coater, and then dried to produce (B-1) layer. To the surface of the produced film, a polyethylene (PE) film (thickness: 100 µm) was stuck as a protective film at a pressure of 1 MPa. This was rolled-up around a plastic tube at a rate of 0.4 m/min and a tension of 30 N to form a roll of Temporary adhesive film for substrate processing (D-1) with a diameter of 130 mm.

In the same manner, application and rolling-up were performed using (Solution A-2) and (Solution C-1) to produce the roll of (E-1); using (Solution B-1) and (Solution C-1) to produce the rolls of (F-1) and (F-2).

Example 1

From the roll of Temporary adhesive film for substrate processing (A-1), the temporary adhesive film for substrate processing was unwound while separating the protective film and laminated onto a glass plate with a diameter of 200 mm (thickness: 500 µm) as a support by using a vacuum laminator TEAM-100 (manufactured by Takatori Corporation) and setting the degree of vacuum in the vacuum chamber to 80 Pa, and then the release backing was removed.

Subsequently, a silicon wafer with a diameter of 200 mm (thickness: 725 µm) and the glass plate having the temporary adhesive film for substrate processing were bonded in a vacuum bonding apparatus (EVG520IS) under the conditions shown in Table 1 so as to adjoin the surface having copper posts of the silicon wafer and the temporary adhesive film on the glass plate with each other to produce a laminate. This was performed at a bonding temperature described in Table 1, at a pressure in the chamber of $10^{-3}$ mbar or less in bonding, and with loading of 5 kN. The laminate was then heated at 120° C. for 1 minute to be stuck and bound to produce a sample.

Examples 2 to 6 and Comparative Examples 1 to 2

The same treatment as in Example 1 was performed under the conditions described in Table 1 to produce samples of Examples 2 to 6 and Comparative Examples 1 to 2.

Incidentally, these examples employed a glass plate as a support for the purpose of visually observing abnormalities after bonding the substrate, but a silicon substrate such as a wafer, which does not transmit light, can also be used instead.

Then, the bonded substrate (sample) was subjected to the following tests. The results of Examples and Comparative Examples are shown in Table 1. Additionally, evaluations were carried out in the order described below and stopped when the result was judged as "poor" after the back surface grinding resistance test without conducting the subsequent evaluations.

—Adhesion Test—

As described above, the obtained laminate (sample) was visually observed for the adhesion state of the interface. When no abnormality like bubbles was found at the interface, the laminate was evaluated as good, and expressed as "good". When an abnormality was found, the laminate was evaluated as poor, and expressed as "poor".

—Back Surface Grinding Resistance Test—

As described above, the obtained laminate (sample) was subjected to grinding of the back surface of the silicon wafer with a grinder (DAG810, manufactured by DISCO Co., Ltd.) using a diamond grinding wheel. After the wafer was ground to a final substrate thickness of 50 μm, abnormities such as crack and separation were checked with an optical microscope (100-folds). When no abnormity was found, the result was expressed as "good", and when an abnormity was found, the result was expressed as "poor".

—Chemical Resistance Test—

The laminate (sample) after the back surface grinding resistance test was treated by immersing in a $H_2SO_4/H_2O_2$ solution (molar ratio 1:1) for 10 minutes, and the treated sample was rinsed with pure water.

Subsequently, the sample was treated by immersing in a $NH_4OH/H_2O_2/H_2O$ solution for 10 minutes, and the treated sample was rinsed with pure water. The treated sample was observed through an optical microscope (×100) to check the existence of peeling. The test results are expressed as "good" when peeling was not caused and expressed as "poor" when peeling was formed.

—Separation Test—

Separation ability of the substrate was evaluated in the following manner. First, a dicing tape was stuck to the wafer side of the processed wafer after finishing the Chemical resistance test, in which the wafer had been thinned to 50 μm, using a dicing frame. This dicing tape surface was set to a suction plate by vacuum suction. Then, one point of the glass was lifted by tweezers at room temperature to separate the glass substrate. When it could be separated without cracking the 50-μm wafer, the result was expressed as "good". When an abnormality such as cracking occurred, the result was evaluated as poor, and expressed as "poor".

—Cleaning Removability Test—

After the separation test, the 200-mm wafer mounted on the dicing frame via the dicing tape was set on a spin coater. Isononane was then sprayed as a cleaning solvent for 3 minutes, and the wafer was rinsed by spraying isopropyl alcohol (IPA) while the wafer was rotated. Thereafter, appearance of the wafer was observed, and residue of the adhesive material resin was visually checked. When no resin remained, the laminate was evaluated as good, and expressed as "good". When the resin remained, the laminate was evaluated as poor, and expressed as "poor".

—Stain Resistance Test—

The surface of the substrate after the cleaning removability test was observed through an optical microscope (λ100) to evaluate the surface appearance. When no abnormality was observed on the surface, the laminate was evaluated as good, and expressed as "good". When an abnormality was observed, the laminate was evaluated as poor, and expressed as "poor".

—Peeling Strength Test—

The temporary adhesive film for substrate processing produced in the step of producing a film was laminated to Silicon wafer A with a diameter of 200 mm (thickness: 725 μm) as a support, and the release backing was removed. Then, Silicon wafer B with a diameter of 200 mm (thickness: 725 μm), the surface of which had been subjected to release molding treatment previously, and the support having the temporary adhesive film for substrate processing were bonded in a vacuum bonding apparatus under the conditions shown in Table 1 so that the release molding treated surface of the Silicon wafer B and the temporary adhesive film on the support faced each other to produce a laminate. Then this laminate was heated under the conditions shown in Table 1 to perform adhesion and bonding. From the laminate, only the silicon wafer B subjected to release molding treatment was removed to produce a laminate in which the temporary adhesive film for substrate processing was laminated on the Silicon wafer A.

Subsequently, five polyimide tapes each having a length of 150 mm and a width of 25 mm were bonded onto the layer of the temporary adhesive film for substrate processing of the laminate, and a part of the temporary adhesive layer to which no tape has been bonded was removed. Using AUTOGRAPH (AG-Xplus) manufactured by Shimadzu Co., 60 mm of the tapes were then peeled off from one end by 180° peeling at a rate of 300 mm/min under an atmosphere of 25° C., and an average force applied at this time (120 mm stroke, 5 times) was measured as a peeling strength of the temporary adhesive layer.

TABLE 1

|  | Example 1 | Example 2 | Example 3 | Example 4 | Example 5 | Example 6 | Comparative Example 1 | Comparative Example 2 |
| --- | --- | --- | --- | --- | --- | --- | --- | --- |
| Temporary adhesive film | A-1 | A-2 | B-1 | D-1 | E-1 | F-1 | C-1 | F-2 |
| Film thickness of temporary adhesive film | 40 μm | 30 μm | 10 μm | 50 μm (A-1) + 10 μm (B-1) | 30 μm (A-2) + 20 μm (C-1) | 5 μm (B-1) + 45 μm (C-1) | 30 μm | 2 μm (B-1) + 48 μm (C-1) |
| Contents of siloxane | 99% | 99% | 99% | 99% | 80% | 10% | 0% | 4% |
| Adhesion temperature | 120° C. | 140° C. | 100° C. | 120° C. | 120° C. | 120° C. | 120° C. | 120° C. |
| Adhesion time | 1 min | 1 min | 1 min | 1 min | 1 min | 1 min | 1 min | 1 min |
| Adhesion | good | good | good | good | good | good | good | good |
| Back surface grinding resistance | good | good | good | good | good | good | good | good |
| Chemical resistance | good | good | good | good | good | good | poor | poor |
| Separation | good | good | good | good | good | good | — | — |
| Cleaning removability | good | good | good | good | good | good | — | — |
| Stain resistance | good | good | good | good | good | good | — | — |
| Peeling strength | 200 mN | 300 mN | 100 mN | 100 mN | 250 mN | 200 mN | 1000 mN | 400 mN |

As shown in Table 1, it was found that the temporary adhesive films for substrate processing to meet the requirements of the present invention makes temporary adhesion of a substrate and a support easier, is easily separated, excels particularly in chemical resistance, and does not cause peeling at the interface of the adhesive even in a processing step (Examples 1 to 6). On the other hand, in Comparative Examples 1 and 2 without fulfilling the requirements of the present invention, the chemical resistance was lowered, and peeling was formed at the interface of the adhesive to make the subsequent processing of grinding polishing unfeasible.

As shown from the results described above, the inventive method for manufacturing a thin substrate employs a specific temporary adhesive film for substrate processing to be laminated onto a substrate or a support, thereby making it possible to form a temporary adhesive material layer onto a substrate or a support in steps (a) to (b) easily and in a short time to have excellent resistance to polishing treatment in the step (c) and to treatment with acid or base in the step (d). In the present invention, the temporary adhesive material formed on a substrate or a support is also improved in dimensional stability to decrease the deformation of the laminate, highly adaptable to the step (e) (e.g., the step of forming a TSV, the step of forming a wiring layer on the back surface), and excellent in filling characteristics and heat resistance. In the step (f), the produced thin substrate can be easily separated from a support, for example, at room temperature, and even a fragile thin substrate can be produced easily thereby. In the step (g), the temporary adhesive material remained on the substrate surface can be easily removed by cleaning, thereby making it possible to produce a thin substrate without staining the surface. In particular, due to the advantage of excellent resistance (chemical resistance) to treatment with acid or base in the step (d), the temporary adhesive material layer in bonding a substrate to a support is provided with sufficient durability that can withstand the subsequent steps while enabling a thin substrate to be separated from a support conveniently at the end, and accordingly, it is possible to widen the variation of processing that can be adopted in the step (e). Therefore, the inventive method is highly valuable in practical use.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

The invention claimed is:

1. A method for manufacturing a thin substrate using a temporary adhesive film for temporary adhesion of a substrate to a support on a surface of the substrate opposite to a surface to be processed, the method comprising, in order:
   coating a solution for the temporary adhesive film onto a release backing using any one of a forward roll coater, a reverse roll coater, a comma coater, a die coater, a lip coater, a gravure coater, a dip coater, an air knife coater, a capillary coater, a raising & rising (R&R) coater, a blade coater, a bar coater, an applicator, and an extruder; and drying the coated release backing at 40° C. to 130° C. to remove any organic solvent and volatile components from the solution, thereby forming a laminate of the temporary adhesive film and the release backing;
   rolling up the laminate to obtain a temporary adhesive film roll;
   separating at least a portion of the temporary adhesive film from the temporary adhesive film roll and laminating the separated portion of the temporary adhesive film onto the support and/or the surface of the substrate opposite to the surface to be processed, and then removing the release backing;
   bonding the substrate and the support under reduced pressure via the temporary adhesive film;
   processing the substrate by grinding or polishing the surface to be processed of the substrate;
   treating the surface to be processed of the substrate with acid or base;
   processing the surface to be processed of the substrate by processing other than grinding, polishing, or treatment with acid or base;
   separating the processed substrate from the support; and
   cleaning the substrate, wherein:
   the temporary adhesive film contains a siloxane bond-containing polymer having a weight average molecular weight of 3,000 to 500,000 in an amount of 10 parts by mass or more and 100 parts by mass or less relative to 100 parts by mass of the total mass of the temporary adhesive film, and
   the temporary adhesive film exhibits a peeling strength of 20 mN/25mm or more and 500 mN/25mm or less between the temporary adhesive film and the substrate or the support in a peel test at 25° C. in a direction of 180°.

2. The method for manufacturing a thin substrate according to claim 1, wherein the siloxane bond-containing polymer has a repeating unit shown by the following general formula (1):

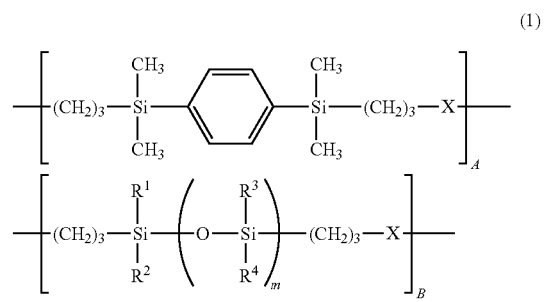

wherein $R^1$ to $R^4$ each independently represent the same or different monovalent hydrocarbon group having 1 to 8 carbon atoms; "m" is an integer of 1 to 100; B is a positive number, A is 0 or a positive number, provided that A+B=1; and "x" represents a divalent organic group shown by the following general formula (2):

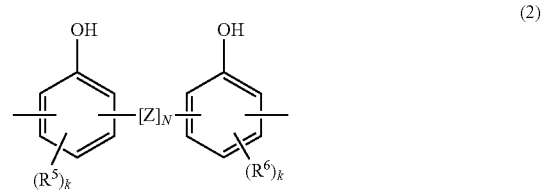

wherein Z represents a divalent organic group selected from any of

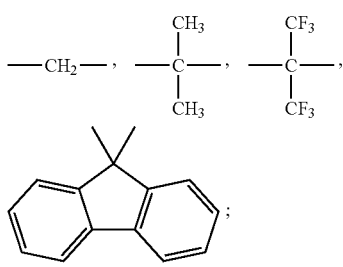

N represents 0 or 1; $R^5$ and $R^6$ each independently represent the same or different alkyl or alkoxy group having 1 to 4 carbon atoms; and "k" represents any of 0, 1, and 2.

3. The method for manufacturing a thin substrate according to claim 1, wherein the siloxane bond-containing polymer has a repeating unit shown by the following general formula (3):

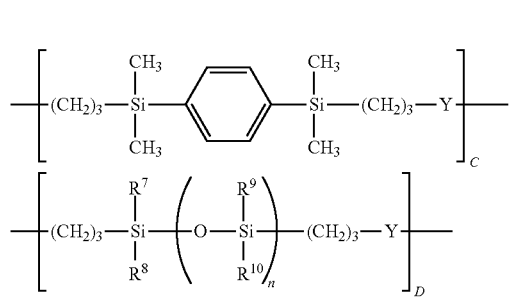

wherein $R^7$ to $R^{10}$ each independently represent the same or different monovalent hydrocarbon group having 1 to 8 carbon atoms; "n" is an integer of 1 to 100; D is a positive number, C is 0 or a positive number, provided that C+D=1; and Y is a divalent organic group shown by the following general formula (4):

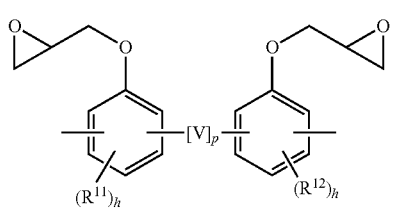

wherein V represents a divalent organic group selected from any of

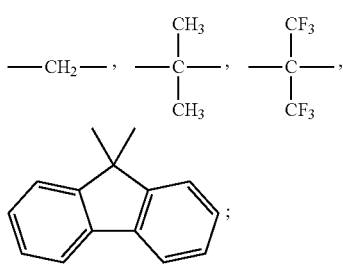

"p" represents 0 or 1; $R^{11}$ and $R^{12}$ each independently represent the same or different alkyl or alkoxy group having 1 to 4 carbon atoms; and "h" is any of 0, 1, and 2.

4. The method for manufacturing a thin substrate according to claim 2, wherein the siloxane bond-containing polymer has a repeating unit shown by the following general formula (3):

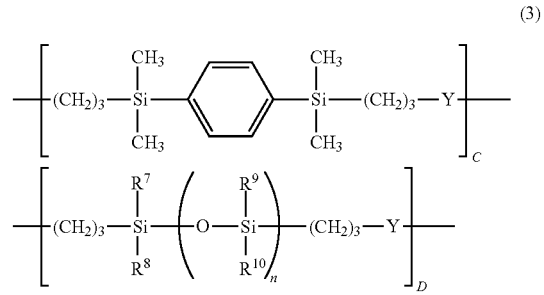

wherein $R^7$ to $R^{10}$ each independently represent the same or different monovalent hydrocarbon group having 1 to 8 carbon atoms; "n" is an integer of 1 to 100; D is a positive number, C is 0 or a positive number, provided that C+D=1; and Y is a divalent organic group shown by the following general formula (4):

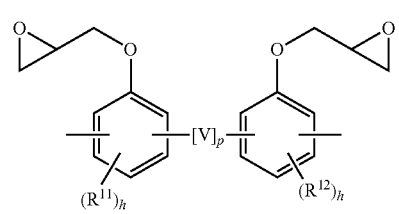

wherein V represents a divalent organic group selected from any of

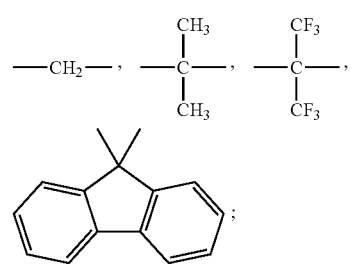

"p" represents 0 or 1; $R^{11}$ and $R^{12}$ each independently represent the same or different alkyl or alkoxy group having 1 to 4 carbon atoms; and "h" is any of 0, 1, and 2.

5. The method for manufacturing a thin substrate according to claim 1, wherein the siloxane bond-containing polymer is a cured material of a composition containing:
(p1) an organopolysiloxane having an alkenyl group in a molecule thereof;
(p2) an organohydrogenpolysiloxane containing two or more silicon atom-bonded hydrogen atoms (Si-H groups) in a molecule thereof, in such an amount that a mole ratio of the Si-H group in the component (p2) to the alkenyl group in the component (p1) ranges from 0.3 to 15; and (p3) a platinum-based catalyst.

* * * * *